(12) United States Patent
Jung et al.

(10) Patent No.: US 9,958,845 B2
(45) Date of Patent: May 1, 2018

(54) STORAGE DEVICE, OPERATION METHOD OF STORAGE DEVICE AND METHOD OF ACCESSING STORAGE DEVICE

(71) Applicants: Goeun Jung, Hwaseong-si (KR); Kyungryun Kim, Seoul (KR); Sangyong Yoon, Seoul (KR); Seung-Cheol Han, Seoul (KR)

(72) Inventors: Goeun Jung, Hwaseong-si (KR); Kyungryun Kim, Seoul (KR); Sangyong Yoon, Seoul (KR); Seung-Cheol Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 390 days.

(21) Appl. No.: 14/638,012

(22) Filed: Mar. 4, 2015

(65) Prior Publication Data
US 2016/0033976 A1 Feb. 4, 2016

(30) Foreign Application Priority Data

Jul. 29, 2014 (KR) ........................ 10-2014-0096674

(51) Int. Cl.
| | | |
|---|---|---|
| *G05B 15/02* | (2006.01) | |
| *G11C 7/04* | (2006.01) | |
| *G11C 16/04* | (2006.01) | |
| *G11C 16/26* | (2006.01) | |
| *G11C 16/32* | (2006.01) | |

(52) U.S. Cl.
CPC ............. *G05B 15/02* (2013.01); *G11C 7/04* (2013.01); *G11C 16/0483* (2013.01); *G11C 16/26* (2013.01); *G11C 16/32* (2013.01)

(58) Field of Classification Search
CPC ...... G05B 15/02; G11C 7/04; G11C 16/0483; G11C 16/26; G11C 16/32
See application file for complete search history.

(56) References Cited

U.S. PATENT DOCUMENTS

| | | |
|---|---|---|
| 8,159,897 B2 | 4/2012 | Cornwell et al. |
| 8,248,856 B2 | 8/2012 | Goss et al. |
| 8,261,136 B2 | 9/2012 | D'Abreu et al. |
| 8,321,625 B2 | 11/2012 | Weingarten et al. |
| 8,644,099 B2 | 2/2014 | Cometti et al. |
| 8,645,770 B2 | 2/2014 | Fai |

(Continued)

FOREIGN PATENT DOCUMENTS

| | | | | |
|---|---|---|---|---|
| JP | 2000011670 A | * | 1/2000 | ......... G11C 13/0069 |
| JP | 2001357688 | | 12/2001 | |

(Continued)

*Primary Examiner* — Thomas Lee
*Assistant Examiner* — Vincent Chang
(74) *Attorney, Agent, or Firm* — Volentine & Whitt, PLLC

(57) ABSTRACT

A method of operating a storage device includes a nonvolatile memory device, a controller configured to control the nonvolatile memory device and a temperature sensor configured to measure a temperature of the nonvolatile memory device. The method includes calculating an average sensing temperature of a sensing temperature measured by the temperature sensor for a period of time, and periodically calculating an elapsed time of data after the data is programmed in the nonvolatile memory device based upon the average sensing temperature.

15 Claims, 16 Drawing Sheets

(56) References Cited

U.S. PATENT DOCUMENTS

| | | |
|---|---|---|
| 2009/0228640 A1 | 9/2009 | Kurashige |
| 2010/0180073 A1* | 7/2010 | Weingarten ......... G06F 12/0246 |
| | | 711/103 |
| 2012/0239976 A1* | 9/2012 | Cometti ................ G11C 16/26 |
| | | 714/24 |
| 2013/0185606 A1* | 7/2013 | Fai ...................... G06F 11/1068 |
| | | 714/704 |
| 2014/0059405 A1 | 2/2014 | Syu et al. |

FOREIGN PATENT DOCUMENTS

| | | |
|---|---|---|
| JP | 2009026119 | 2/2009 |
| JP | 2010165039 | 7/2010 |
| JP | 2013058115 | 3/2013 |

\* cited by examiner

FIG. 11

| | R1_AT (Cold) | R2_AT (reference) | R3_AT Hot |
|---|---|---|---|
| R1_ET (0≤ET<T1) | WET1 | WET4 (>WET1) | WET7 (>WET4) |
| R2_ET (T1≤ET<T2) | WET2 (>WET1) | WET5 (>WET2 & >WET4) | WET8 (>WET5 & >WET7) |
| R3_ET (T2≤ET<T3) | WET3 (>WET2) | WET6 (>WET3 & >WET5) | WET9 (>WET6 & >WET8) |

PDT

FIG. 12

| DATA | Elapsed Time Stemp |
|---|---|
| DATA1 | ET1 |
| DATA2 | ET2 |
| DATA3 | ET3 |
| ⋮ | ⋮ |
| DATA(n-1) | ET(n-1) |
| DATAn | ETn |

TST

STORAGE DEVICE, OPERATION METHOD OF STORAGE DEVICE AND METHOD OF ACCESSING STORAGE DEVICE

CROSS-REFERENCE TO RELATED APPLICATIONS

This U.S. non-provisional patent application claims priority under 35 U.S.C. § 119 of Korean Patent Application No. 10-2014-0096674, filed on Jul. 29, 2014, the entire contents of which are hereby incorporated by reference.

BACKGROUND OF THE INVENTION

The inventive concept relates to a storage device, an operation method of a storage device and a method of accessing a storage device.

A storage device stores data under the control of a host device such as a computer, a smart phone and a smart pad. A storage device may include a device storing data in a magnetic disk such as a hard disk drive (HDD) and a device storing data in a semiconductor memory such as a solid state drive (SSD) and a memory card, in particular, in a nonvolatile memory. A nonvolatile memory may include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

As semiconductor manufacturing technology develops, the integration of a semiconductor memory is continuously being improved. The improvement of the integration of a semiconductor memory has an advantage of greatly improving the capacity of a storage device formed by a semiconductor memory. The improvement of the integration of a semiconductor memory may also have a disadvantage of increasing the probability that an error occurs in data written in a semiconductor memory, that is, an error rate. Thus, the demand for a new technology that can reduce an error rate of a storage device including a semiconductor memory and improve reliability is continuously required.

SUMMARY

Embodiments of the inventive concept provide a method of operating a storage device including a nonvolatile memory device, a controller to control the nonvolatile memory device and a temperature sensor configured to measure a temperature of the nonvolatile memory device. The operation method may include: calculating an average sensing temperature of a sensing temperature measured by the temperature sensor for a period of time; and periodically calculating an elapsed time of data after the data is programmed in the nonvolatile memory device using the average sensing temperature.

Embodiments of the inventive concept also provide a storage device. The storage device may include: a nonvolatile memory device; a memory controller to control the nonvolatile memory device; and a temperature sensor configured to measure a temperature of the nonvolatile memory device. The memory controller calculates an average sensing temperature using the sensing temperature measured in the temperature sensor and controls a read voltage level reflecting the average sensing temperature and an elapsed time of data after the data is programmed in the nonvolatile memory device.

Embodiments of the inventive concept also provide a method of accessing a storage device including a nonvolatile memory device and a temperature sensor configured to measure a temperature of the nonvolatile memory device. The method may include: periodically calculating a sensing temperature sensed by a temperature sensor as an average sensing temperature; and periodically renewing an elapsed time of data after the data is programmed in the nonvolatile memory device in the form of an elapsed time stamp. The elapsed time is renewed to reflect a weighted elapsed time to which the amount being weighted is differently applied depending on a change of the average sensing temperature and a length of the elapsed time previously renewed.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 11 is a table being used to calculate elapsed time.

FIG. 12 is a table illustrating an example of elapsed time stamps registered in a time stamp table.

DETAILED DESCRIPTION OF PREFERRED EMBODIMENTS

Figure 1:
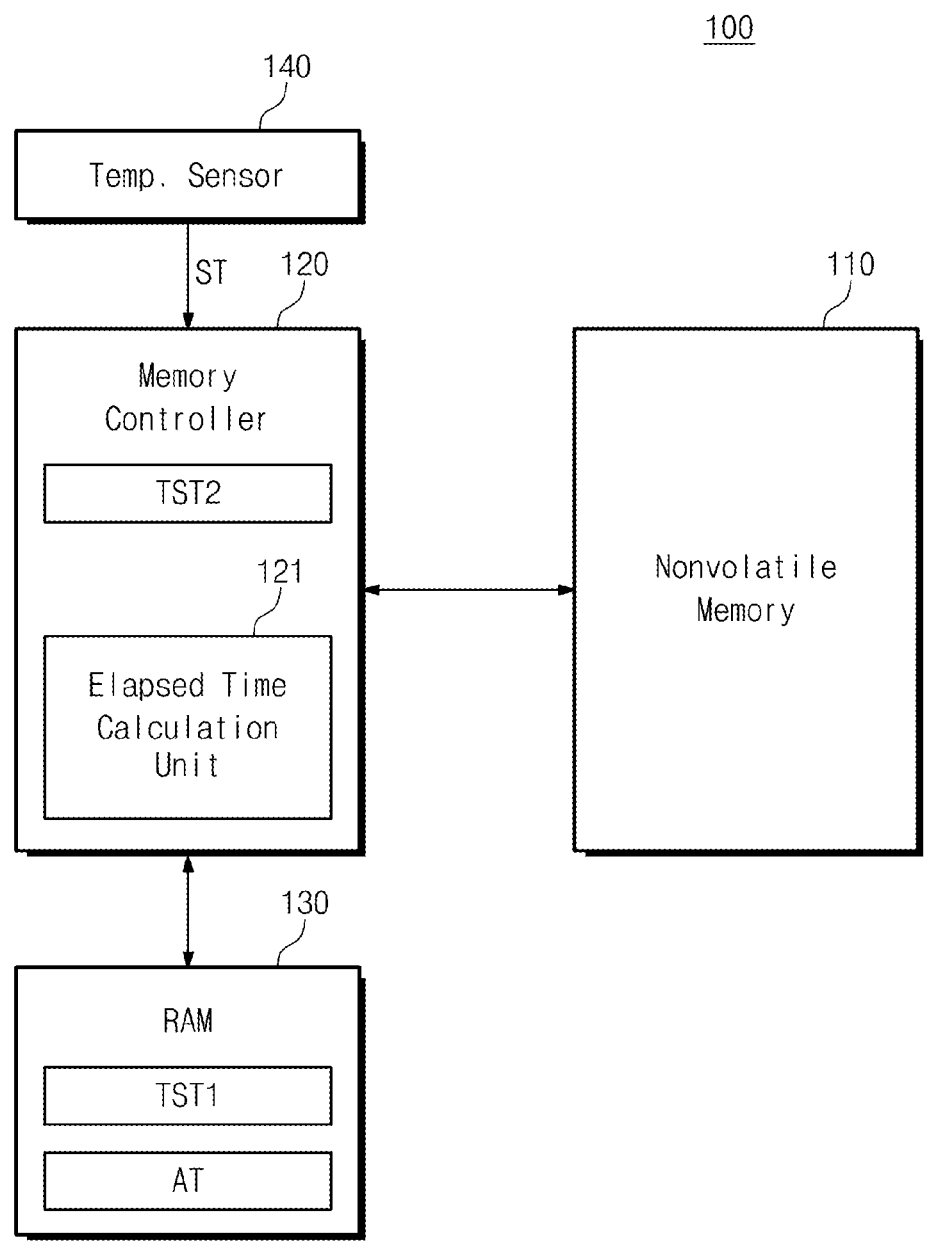
FIG. 1 is a block diagram illustrating a storage device in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a storage device in accordance with some embodiments of the inventive concept. Referring to FIG. 1, a storage device 100 includes a nonvolatile memory device 110, a memory controller 120, a RAM 130, and a temperature sensor 140. The storage device 100 can form a solid state drive SSD, a memory card, or a mount-type memory.

The nonvolatile memory 110 can perform write, read and erase operations under the control of the memory controller 120. The nonvolatile memory 110 may include a flash memory. However, the nonvolatile memory 110 is not limited to a flash memory. The nonvolatile memory 110 may include at least one of various nonvolatile memories such as a PRAM, a MRAM, an RRAM, and a FeRAM, for example.

The memory controller 120 can control the nonvolatile memory device 110 according to a request of an external host or a schedule previously stored. For example, the memory controller 120 can control so that the nonvolatile memory device 110 performs a write, read or erase operation.

The memory controller 120 can use the RAM 130 as a buffer memory, a cache memory, or an operation memory. The memory controller 120 can store data received from an external host device in the RAM 130 and write data stored in the RAM 130 in the nonvolatile memory device 110. The memory controller 120 can store data read from the nonvolatile memory device 110 in the RAM 130 and write data stored in the RAM 130 in the nonvolatile memory device 110 again. The memory controller 120 can store data or code needed to manage the nonvolatile memory device 110 in the RAM 130.

The memory controller 120 includes an elapsed time calculation unit 121. The elapsed time calculation unit 121 can receive a sensing temperature ST from the temperature sensor 140. The elapsed time calculation unit 121 can read a sensing temperature ST from the temperature sensor 140. The elapsed time calculation unit 121 can read a sensing temperature ST at regular times and obtain an average sensing temperature AT of a plurality of sensing temperatures ST at each certain period of time. The elapsed time calculation unit 121 can store the average sensing temperature AT in the RAM 130.

The elapsed time calculation unit 121 can access the average sensing temperature AT to calculate the elapsed time ET. The elapsed time calculation unit 121 can store the calculated elapsed time ET in a first time stamp table TST1 of the RAM 130.

The memory controller 120 can program or read data from the nonvolatile memory device 110 using the elapsed time ET stored in the first time stamp table TST1. The memory controller 120 can back the first time stamp table TST1 up in the form of a second time stamp table TST2.

The temperature sensor 140 measures a temperature of the nonvolatile memory device 110 or an ambient temperature of the nonvolatile memory device 110. The temperature sensor 140 may be located inside the nonvolatile memory device 110. The temperature sensor 140 may be located inside the memory controller 120. The storage device 100 can measure a temperature of the nonvolatile memory device 110 or an ambient temperature of the nonvolatile memory device. The storage device 100 can generate a time stamp table TST using a measured sensing temperature and time elapsed after data is programmed in the nonvolatile memory device 110.

Figure 2:
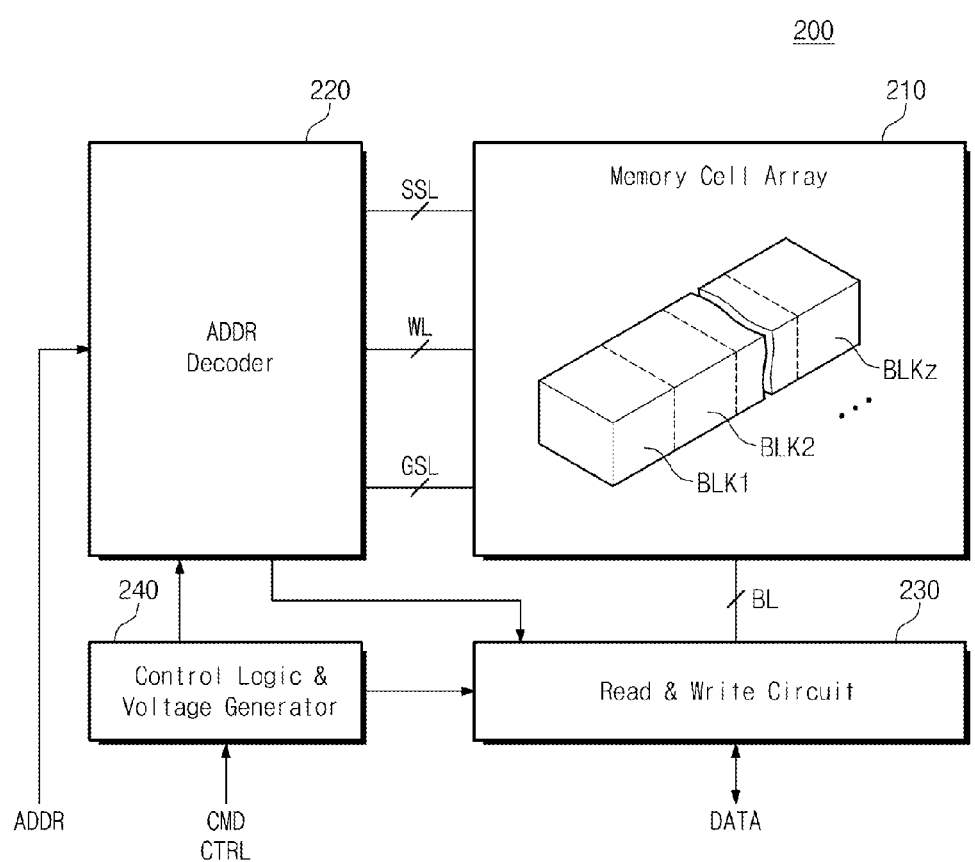
FIG. 2 is a block diagram illustrating a nonvolatile memory device in accordance with some embodiments of the inventive concept.

FIG. 2 is a block diagram illustrating a nonvolatile memory device in accordance with some embodiments of the inventive concept. Referring to FIG. 2, a nonvolatile memory device 200 includes a memory cell array 210, an address decoder 220, a read & write circuit 230, and a control logic & voltage generator 240. The nonvolatile memory device 200 has the same structure as the nonvolatile memory device 110 of FIG. 1.

The memory cell array 210 is connected to the address decoder 220 through a plurality of string selection lines SSL, word lines WL, and ground selection lines GSL. The memory cell array 210 is connected to the read & write circuit 230 through a plurality of bit lines BL. The memory cell array 210 includes a plurality of memory blocks BLK1~BLKz (z is an integer of 2 or more). The memory blocks BLK1~BLKz may include a plurality of memory cells and a plurality of selection transistors. The memory cells may be stacked on a substrate to form a three-dimensional structure. Each of the memory cells can store one or more bits.

The address decoder 220 is connected to the memory cell array 210 through a plurality of string selection lines SSL, word lines WL, and ground selection lines GSL. The address decoder 220 operates in response to a control signal of the control logic & voltage generator 240. The address decoder 220 receives an address ADDR from outside the memory device 200.

The address decoder 220 can decode the received address ADDR. The address decoder 220 can control a voltage being applied to word lines WL according to the decoded address. In a program operation, the address decoder 220 can apply a pass voltage to the word lines WL under the control of the control logic and voltage generator 240. In a program operation, the address decoder 220 can further apply a voltage to at least one selected word line indicated by the decoded address among the word lines WL under the control of the control logic & voltage generator 240.

The read & write circuit 230 is connected to the memory cell array 210 through the bit lines BL. The read & write circuit 230 can exchange data DATA with the outside. The read & write circuit 230 operates in response to a control signal of the control logic & voltage generator 240. The read & write circuit 230 receives a decoded column address DCA from the address decoder 220.

The read & write circuit 230 can select a bit line BL using the decoded column address DCA. In a program operation, the read & write circuit 230 receives data DATA from the outside. The read & write circuit 230 applies the received data DATA to the memory cell array 210 through the bit lines BL. In a read operation, the read & write circuit 230 reads data DATA from the memory cell array 210. The read & write circuit 230 transfers the read data DATA to the outside.

The read & write circuit 230 may include a page buffer and a column selection circuit. The read & write circuit 230 may also include a sense amplifier, a write driver, a column selection circuit, etc.

The control logic & voltage generator 240 is connected to the address decoder 220 and the read & write circuit 230. The control logic & voltage generator 240 operates by a control signal CTRL and a command CMD being applied from the outside. The control logic & voltage generator 240 decodes the received command CMD and controls an overall operation of the nonvolatile memory device 200 according to the decoded control signal CTRL. The control logic & voltage generator 240 can generate various control signals and voltages according to the received control signal CTRL.

Figure 3:
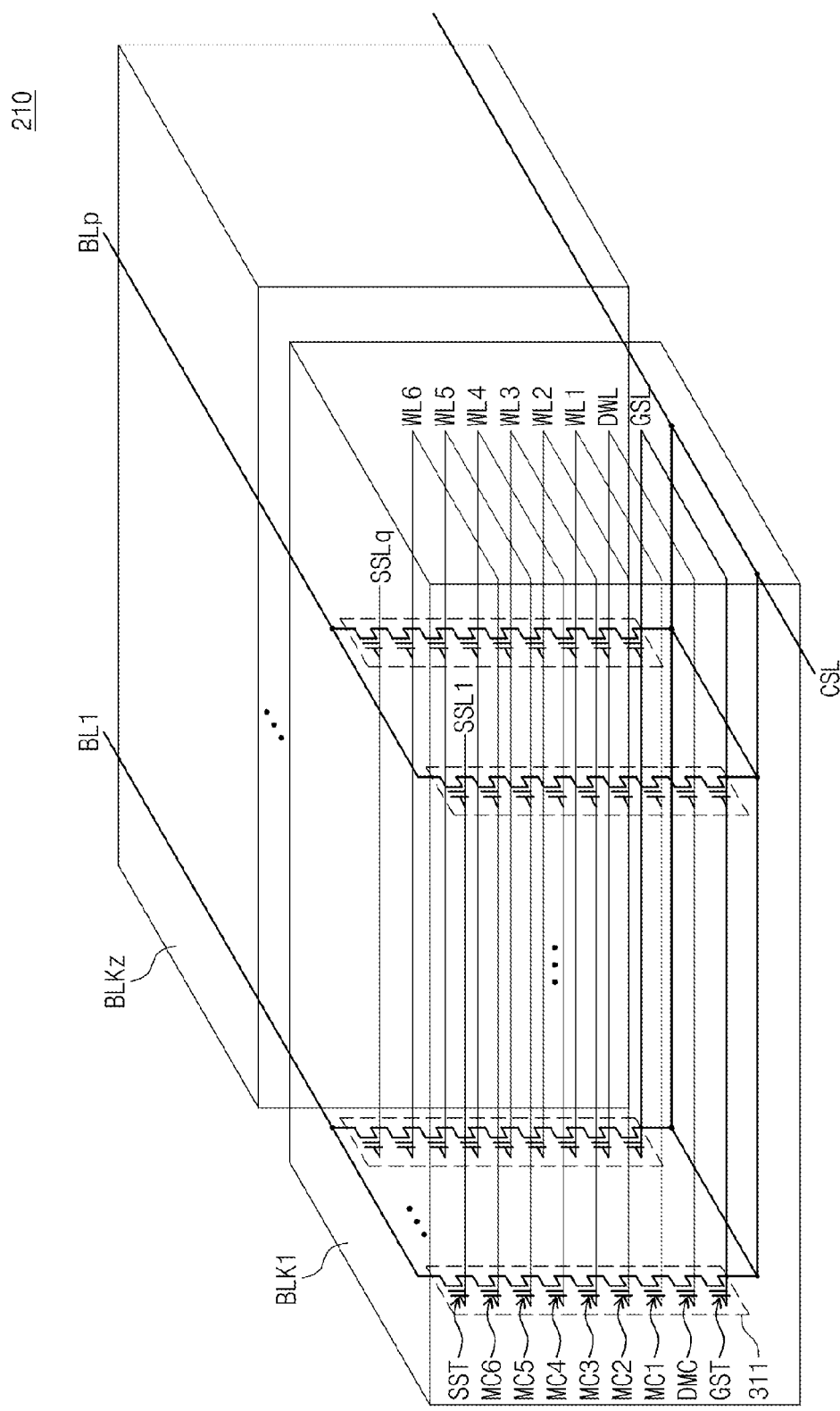
FIG. 3 is a block diagram illustrating memory blocks in accordance with some embodiments of the inventive concept.

FIG. 3 is a block diagram illustrating memory blocks in accordance with some embodiments of the inventive concept. Referring to FIGS. 2 and 3, the memory cell array 210 includes the memory blocks BLK1~BLKz. For convenience of description, a circuit constituting the memory blocks BLK1~BLKz is described with the first memory block BLK1 as the central figure. The remaining memory blocks BLK2~BLKz may have the same constitution as the first memory block BLK1.

The first memory block BLK1 is connected to a plurality of bit lines BL1~BLp (p is an integer of 2 or more). The first memory block BLK1 is connected to a plurality of string lines SSL1~SSLq (q is an integer of 2 or more), first through sixth word lines WL1~WL6, a dummy word line DWL, a ground selection line GSL and a common source line CSL.

A gate of a string selection transistor SST is connected to the string line SSL1. The string selection transistor SST is connected between the bit line BL1 and a sixth memory cell MC6.

First through sixth memory cells MC1~MC6 are serially connected between the string selection transistor SST and the dummy memory cell DMC. Gate terminals of the first through sixth memory cells MC1~MC6 are connected to the first through sixth word lines WL1~WL6 respectively. The memory cell is not limited to the first through sixth memory cells MC1~MC6.

The dummy memory cell DMC is connected between the first memory cell MC1 and a ground selection transistor GST. A gate terminal of the dummy memory cell DMC is connected to the dummy word line DWL. The ground selection transistor GST is connected between the dummy memory cell DMC and the common source line CSL. A gate terminal of the ground selection transistor GST is connected to the ground selection line GSL.

The ground selection transistor GST, the dummy memory cell DMC, the first through sixth memory cells MC1~MC6 and the string selection transistor SST that are connected between the bit line BL1 and the common source line CSL are called a first string 311. A plurality of strings is connected to the bit lines BL1~BLp respectively. The structure of the strings are the same as that of the first string 311.

One string may include memory cells more than the memory cells MC1~MC6. One string may include memory cells less than the memory cells MC1~MC6. A plurality of dummy memory cells instead of a memory cell may be connected to the string selection transistor SST. One or more dummy memory cells may be connected to the first memory cell MC1.

Figure 4:
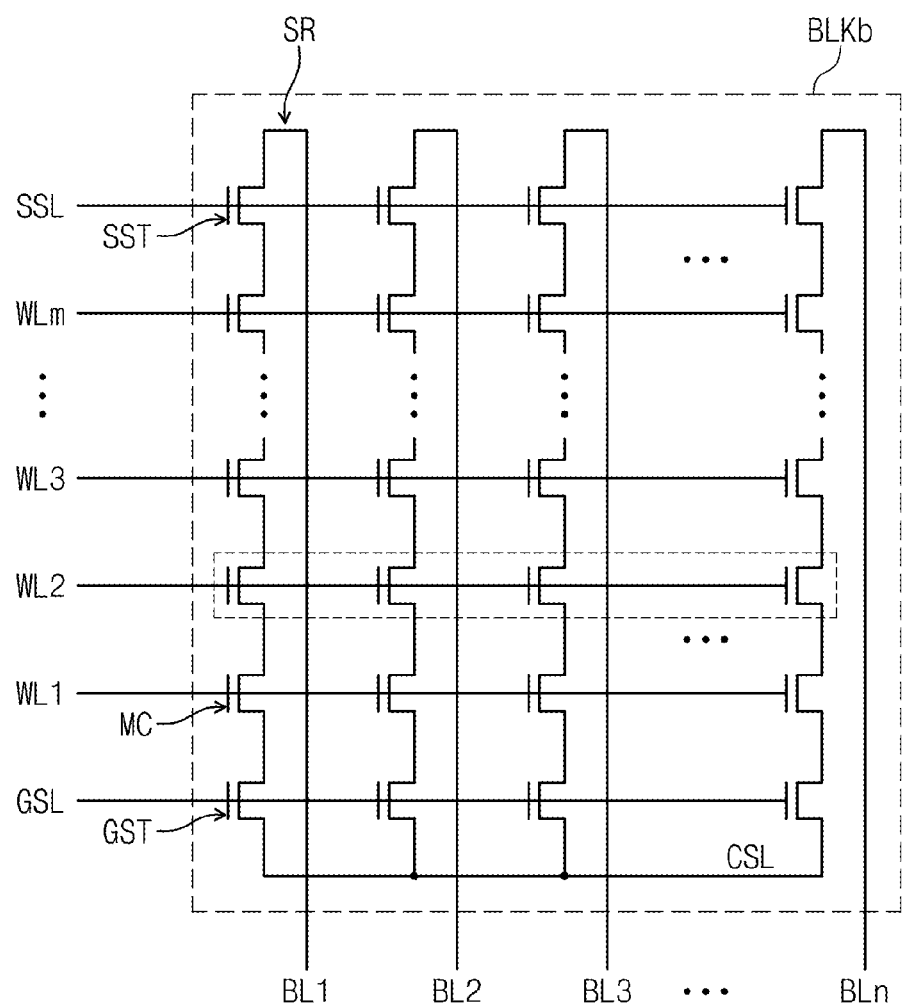
FIG. 4 is a block diagram illustrating memory blocks in accordance with some embodiments of the inventive concept.

FIG. 4 is a block diagram illustrating memory blocks in accordance with some embodiments of the inventive concept. Referring to FIG. 4, a memory block BLKb includes a plurality of strings SR. The strings SR may be connected to a plurality of bit lines BL1~BLn (n is an integer of 2 or more) respectively. Each string SR includes a ground selection transistor GST, memory cells MC and a string selection transistor SST.

A ground selection transistor GST of each string SR is connected between memory cells MC and a common source line CSL. Ground selection transistors GST of the strings SR are connected to the common source line CSL in common A string selection transistor SST of each string SR is connected between memory cells MC and a bit line BL. String selection transistors of the strings SR are connected to a plurality of bit lines BL1~BLn respectively.

In each string SR, a plurality of memory cells MC is provided between a ground selection transistor GST and a string selection transistor SST. In each string SR, the memory cells MC may be serially connected to one another. In the strings SR, memory cells MC located at the same order from the common source line CSL may be connected to one word line in common. Memory cells MC of the strings SR may be connected to a plurality of word lines WL1~WLm (m is an integer of 2 or more).

Figure 5:
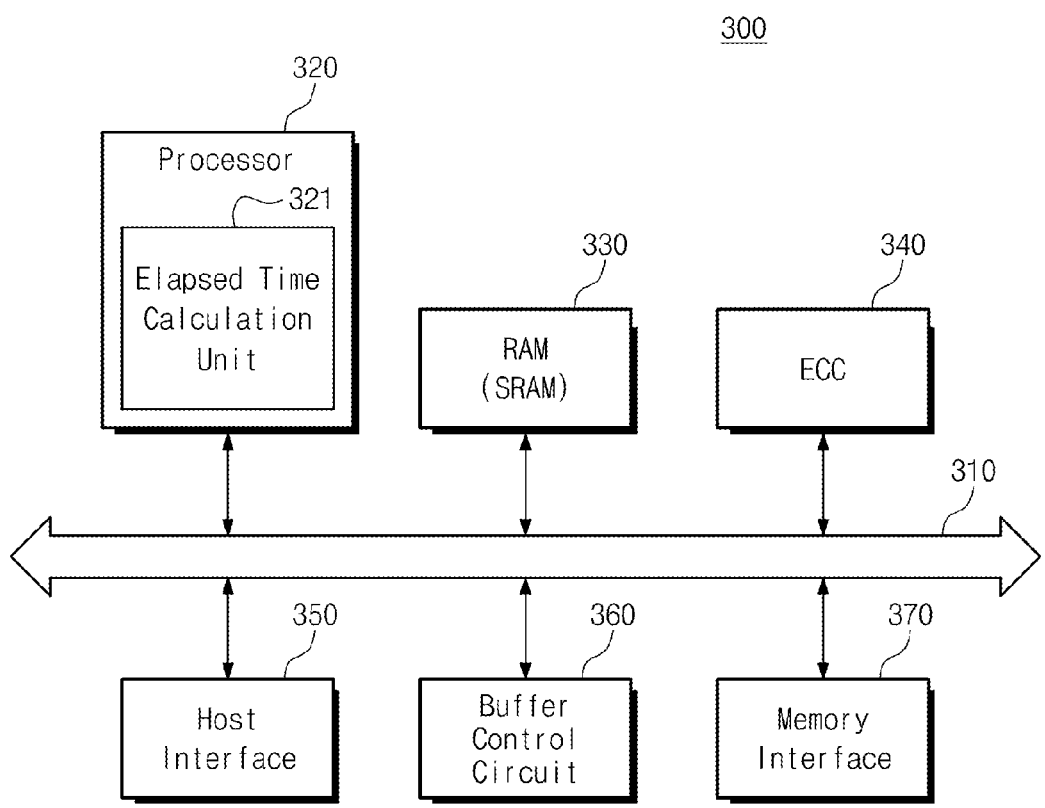
FIG. 5 is a block diagram illustrating a memory controller in accordance with some other embodiments of the inventive concept.

FIG. 5 is a block diagram illustrating a memory controller in accordance with some other embodiments of the inventive concept. Referring to FIG. 5, a memory controller 300 includes a bus 310, a processor 320, a RAM 330, an error correction block 340, a host interface 350, a buffer control circuit 360, and a memory interface 370. The memory controller 300 may have the same structure as the memory controller 120 of FIG. 1.

The bus 310 is configured to provide a channel between constituent elements of the memory controller 300.

The processor 320 can control an overall operation of the memory controller 300 and perform a logical operation. The processor 320 can communicate with an external host through the host interface 350. The processor 320 can store a command or an address being received through the host interface 350 in the RAM 330. The processor 320 can output data being received through the host interface 350 through the buffer control circuit 360 or store it in the RAM 330. The processor 320 can generate an internal command and an address according to the command and the address stored in the RAM 330 and output the generated internal command and address through the memory interface 370.

The processor 320 can output data stored in the RAM 330 or data being received through the buffer control circuit 360 through the memory interface 370. The processor 320 can store data being received through the memory interface 370 or output it through the buffer control circuit 360. The processor 320 can output data being received through the buffer control circuit 360 or data stored in the RAM 330 through the host interface 350 or the memory interface 370.

The processor 320 may include a direct memory access (DMA) and can output data using data.

The processor 320 may include an elapsed time calculation unit 321. The processor 320 can manage a sensing temperature ST, an average sensing temperature AT with respect to the sensing temperature ST and an elapsed time ET using the elapsed time calculation unit 321.

The RAM 330 may be used as an operation memory, a cache memory or a buffer memory. The RAM 330 can store codes and commands being executed by the processor 320. The RAM 330 can store data being processed by the processor 320. The RAM 330 may include a SRAM. However, the RAM 330 is not limited to a SRAM.

The error correction block 340 can perform an error correction. The error correction block 340 can generate parity for performing an error correction based on data to be output to the memory interface 370. The data and the parity can be output through the memory interface 370. The error correction block 340 can perform an error correction of the received data using the data and parity being received through the memory interface 370.

The host interface 350 is configured to communicate with an external host device under the control of the processor 320. The host interface 350 can perform a communication using at least one of various communication methods such as a universal serial bus (USB), a serial at attachment (SATA), a high speed interchip (HSIC), a small computer small interface (SCSI), a Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), etc.

The buffer control circuit 360 is configured to control the RAM 130 (refer to FIG. 1) under the control of the processor 320. The buffer control circuit 360 can write data in the RAM 130 and read data from the RAM 130.

The memory interface 370 is configured to communicate with the nonvolatile memory device 110 (refer to FIG. 1) under the control of the processor 320.

The processor 320 can control the memory controller 300 using codes. The processor 320 can load codes from a nonvolatile memory (for example, a read only memory) being provided inside the memory controller 300. The processor 320 can load codes being received from the memory interface 370.

The memory controller 300 may include the elapsed time calculation unit 321. The memory controller 300 can manage a sensing temperature ST, an average sensing temperature AT with respect to the sensing temperature ST and an elapsed time ET using the elapsed time calculation unit 321. The memory controller 300 can communicate with an external host and the nonvolatile memory device 110.

Figure 6:
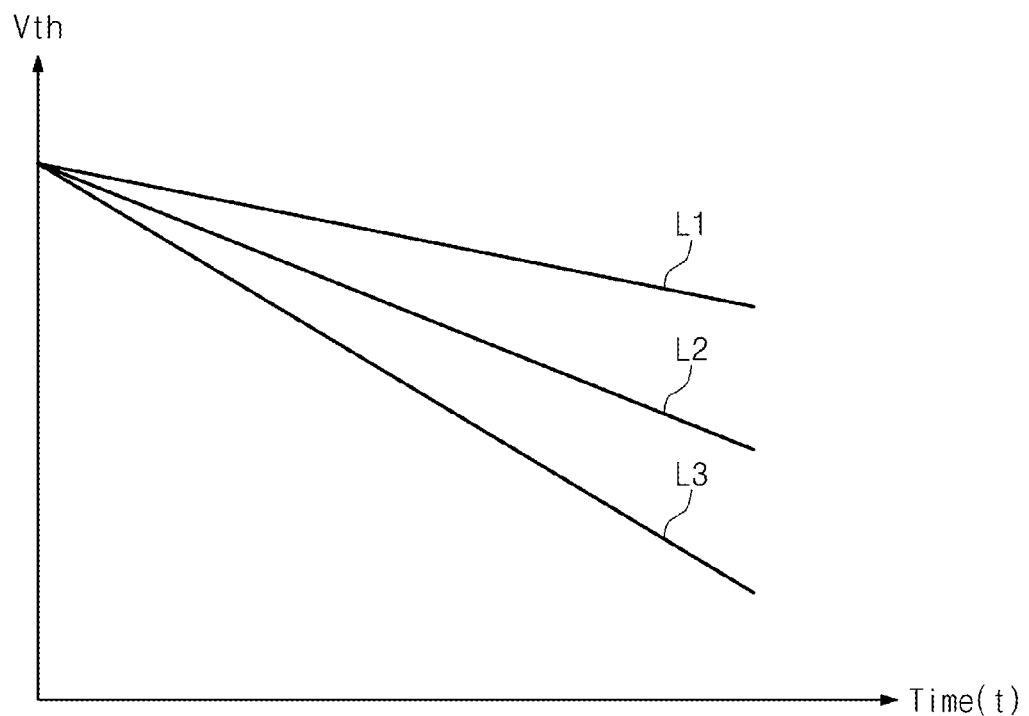
FIG. 6 is a graph illustrating a charge amount flowing out of memory cells of a nonvolatile memory device depending on time and temperature.

FIG. 6 is a graph illustrating a charge amount flowing out of memory cells of a nonvolatile memory device depending on time and temperature. In FIG. 6, a horizontal axis represents time (t) and a vertical axis represents a threshold voltage according to an outflow of charges. The vertical axis is a log value of time (t).

Referring to FIGS. 1 and 6, as time goes by, memory cells of the nonvolatile memory device 110 may lose charges. In FIG. 6, a first line L1 illustrates a reduction of a threshold voltage Vth due to an outflow of charges of the memory cells MC when a temperature of the nonvolatile memory device 110 or an ambient temperature of the nonvolatile memory device 110 is a first temperature (for example, COLD). A second line L2 illustrates a reduction of a threshold voltage Vth due to an outflow of charges of the memory cells MC when a temperature of the nonvolatile memory device 110 or an ambient temperature of the nonvolatile memory device 110 is a second temperature (for example, standard). A third line L3 illustrates a reduction of a threshold voltage Vth due to an outflow of charges of the memory cells MC when a temperature of the nonvolatile memory device 110 or an ambient temperature of the nonvolatile memory device 110 is a third temperature (for example, HOT).

As time (t) goes by, the memory cells MC of the nonvolatile memory device 110 lose more charges. As a temperature becomes higher, the memory cells MC lose more charges. A temperature of the nonvolatile memory device 110 or an ambient temperature of the nonvolatile memory device 110 may be changed depending on an operation state or an environment of the nonvolatile memory device 110.

Since the horizontal axis is a log value with respect to the time (t), the first through third lines L1~L3 have a straight line form. However, the form of the first through third lines L1~L3 is not limited to the straight line. The form of the first through third lines L1~L3 may be changed depending on a process change of the nonvolatile memory device 110. If the time (t) of the horizontal axis is not a log value, the first through third lines L1~L3 may have a curved form.

Figure 7:
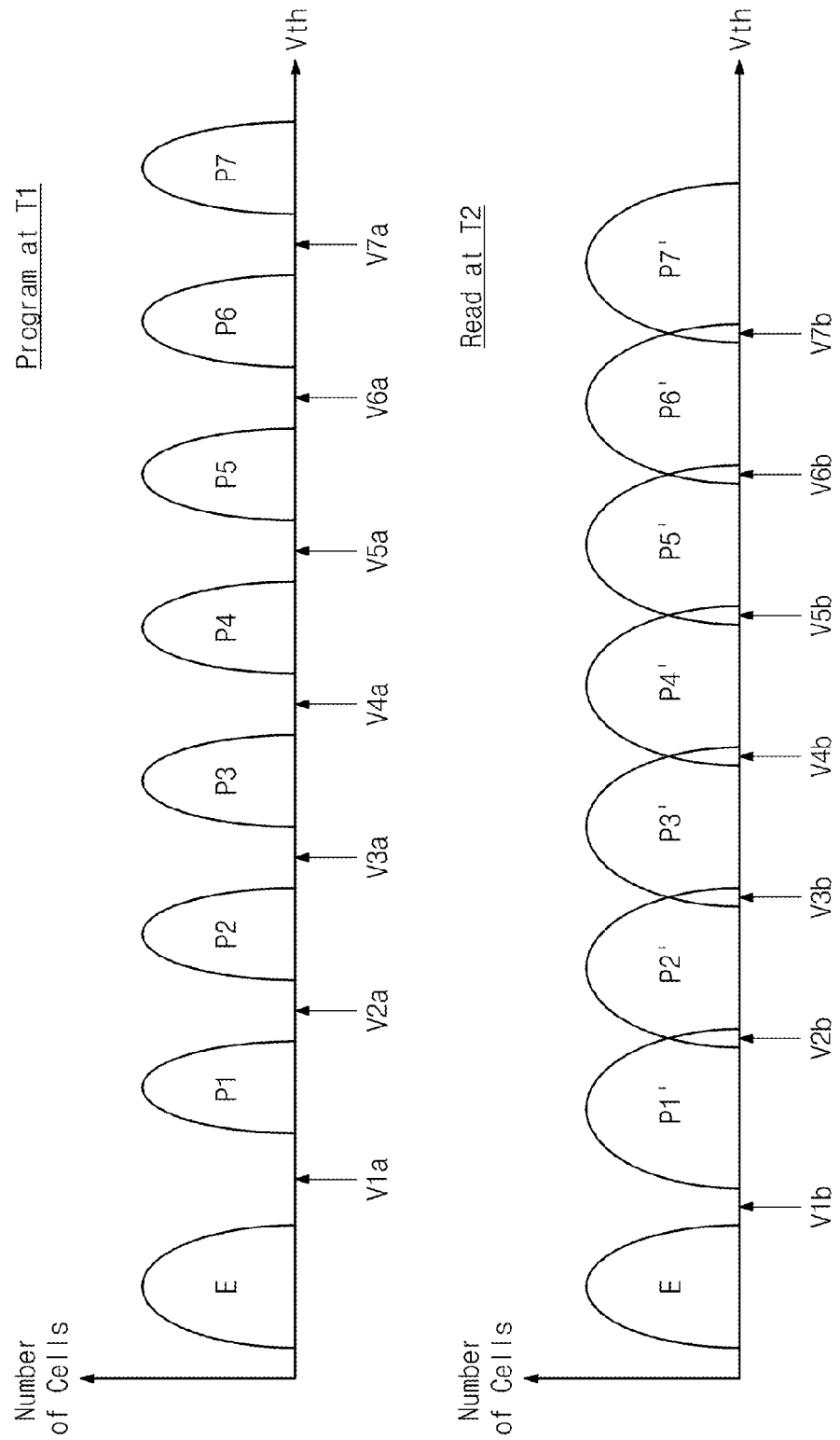
FIG. 7 is a graph illustrating a threshold voltage of memory cells of a nonvolatile memory device.

FIG. 7 is a graph illustrating a threshold voltage of memory cells of a nonvolatile memory device. Referring to FIGS. 1 and 7, data may be written in memory cells MC at a first time T1. It is assumed that the memory cells MC of the nonvolatile memory device 110 are a triple level cell (TLC). The triple level cell TLC can store 3 bit data in one memory cell. However, the inventive concept is not limited thereto. The memory cells MC may be a single level cell SLC or a multi level cell MLC. The single level cell SLC can store 1 bit data and the multi level cell MLC can store 2 bit data. If the memory cells MC are a triple level cell TLC, each of the memory cells MC may be programmed in any one of an erase state E and first through seventh states P1~P7. Data programmed at the time T1 can be deciphered using first through seventh voltages V1a~V7a.

In the case that a threshold voltage of each memory cell MC is lower than the first voltage V1a, each memory cell MC may be deciphered to have a value corresponding to the erase state E. In the case that a threshold voltage of each memory cell MC is between the first voltage V1a and the second voltage V2a, each memory cell MC may be deciphered to have a value corresponding to the first program state P1. In the case that a threshold voltage of each memory cell MC is between the second voltage V2a and the third voltage V3a, each memory cell MC may be deciphered to have a value corresponding to the second program state P2. In the case that a threshold voltage of each memory cell MC is between the third voltage V3a and the fourth voltage V4a, each memory cell MC may be deciphered to have a value corresponding to the third program state P3. In the case that a threshold voltage of each memory cell MC is between the fourth voltage V4a and the fifth voltage V5a, each memory cell MC may be deciphered to have a value corresponding to the fourth program state P4. In the case that a threshold voltage of each memory cell MC is between the fifth voltage V5a and the sixth voltage V6a, each memory cell MC may be deciphered to have a value corresponding to the fifth program state P5. In the case that a threshold voltage of each memory cell MC is between the sixth voltage V6a and the seventh voltage V7a, each memory cell MC may be deciphered to have a value corresponding to the sixth program state P6. In the case that a threshold voltage of each memory cell MC is greater than the seventh voltage V7a, each memory cell MC may be deciphered to have a value corresponding to the seventh program state P7.

If charges flow out of the memory cells MC of the nonvolatile memory device 110, an error may occur in data written in the memory cells MC and a read operation may be performed at a second time T2. After data is written at the first time T1, as time goes by until the second time T2, charges may flow out of the memory cells MC of the nonvolatile memory device 110. Thus, a threshold voltage of the memory cells MC may be lowered. To read data at the second time T2, first through seventh voltages V1b~V7b are applied. The first through seventh voltages V1b~V7b may be lower than the first through seventh voltages V1a~V7a.

The amount of charges flowing out of the memory cells MC may affect an optimum voltage level for deciphering data from the memory cells MC.

The amount of charges flowing out of the memory cells MC may be affected by time and temperature. When a read operation is performed, the storage device 100 calculates the amount of charges which flowed out of the memory cells MC to reduce an error occurring in the read operation due to an outflow of charges. The storage device 100 controls a read voltage considering the amount of charges which flowed out of the memory cells MC.

Figure 8:
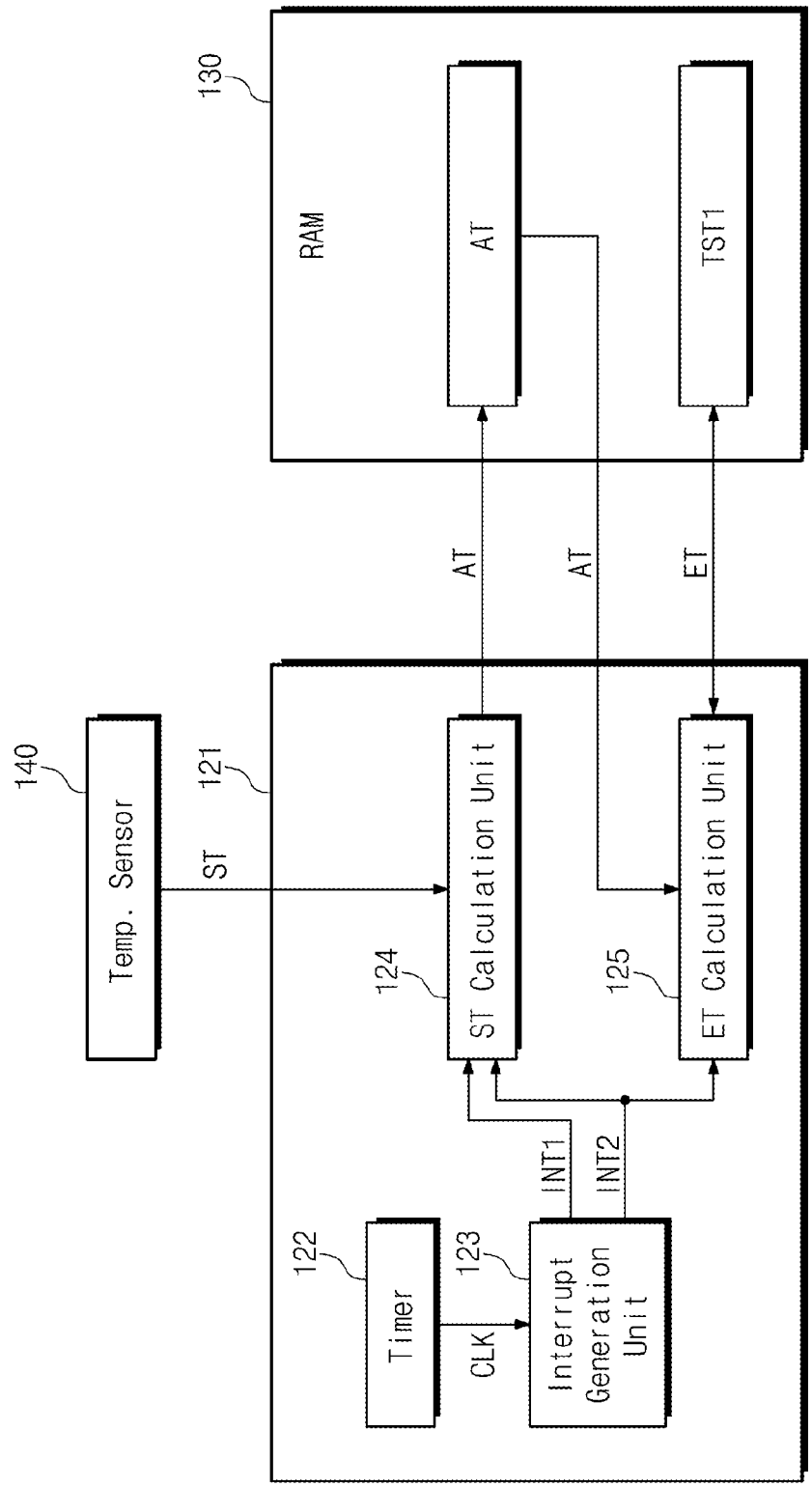
FIG. 8 is a block diagram illustrating an elapsed time calculation unit, and a RAM and a temperature sensor related to the elapsed time calculation unit in accordance with some embodiments of the inventive concept.

FIG. 8 is a block diagram illustrating an elapsed time calculation unit, and a RAM and a temperature sensor related to the elapsed time calculation unit in accordance with some embodiments of the inventive concept. Referring to FIG. 8, an elapsed time calculation unit 121 includes a timer 122, an interrupt generation unit 123, a sensing temperature calculation unit 124 and an elapsed time calculation unit 125.

The timer 122 can output a clock signal CLK. The timer 122 can directly generate the clock signal to output it. The timer 122 may receive the clock signal CLK from the outside to output it in a processed state or an un-processed state.

The interrupt generation unit 123 can receive a clock signal CLK from the timer 122. The interrupt generation unit 123 can generate first and second interrupt signals INT1 and INT2 according to the clock signal CLK. A generation period of the first and second interrupt signals INT1 and INT2 may be different. If a clock signal is generated at every one second, an output of the first interrupt signal INT1 may occur every time when the clock signal CLK is input once.

The sensing temperature calculation unit 124 can receive the first interrupt signal INT1. The sensing temperature calculation unit 124 receives a sensing temperature ST from the temperature sensor 140 each time that the first interrupt signal INT1 is received. The sensing temperature calculation unit 124 can receive the second interrupt signal INT2. If the second interrupt signal INT2 is received to the sensing temperature calculation unit 124, the sensing temperature calculation unit 124 can calculate an average sensing temperature AT with respect to a sensing temperature ST received for a certain period of time. The sensing temperature calculation unit 124 then stores the calculated average sensing temperature AT in the RAM 130.

The elapsed time calculation unit 125 can receive the second interrupt signal INT2. The elapsed time calculation unit 125 can read an average sensing temperature AT and an elapsed time ET from the RAM 130. The elapsed time calculation unit 125 can calculate a new elapsed time ET using the average sensing temperature AT and the elapsed time ET. The average sensing temperature AT and the elapsed time ET contribute to the storing of the new elapsed time ET in the RAM 130.

The first interrupt signal INT1 can be activated over a period of one second. The sensing temperature calculation unit 124 can measure a sensing temperature ST over a period of one second. The sensing temperature calculation unit 124 can calculate an average sensing temperature AT over a period of 1000 seconds using the measured sensing temperature ST. That is, the average sensing temperature AT stored in the RAM 130 can be renewed over a period of 1000 seconds.

Figure 9:
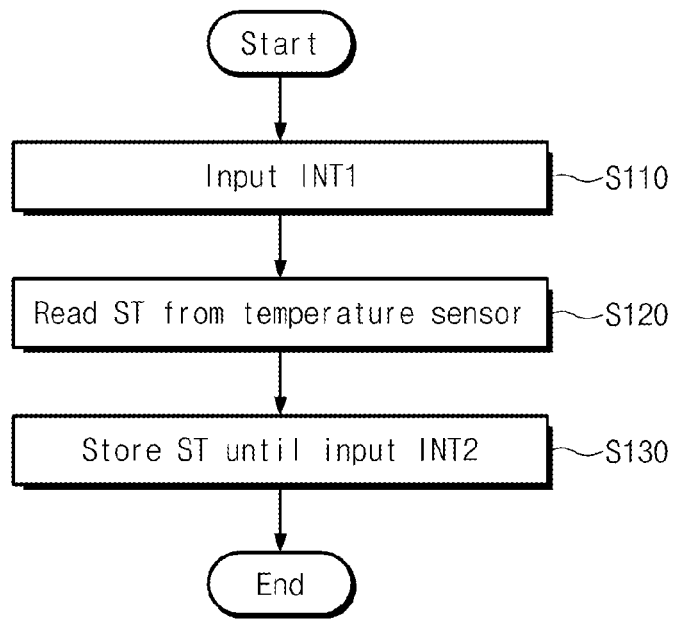
FIG. 9 is a flowchart illustrating a method of detecting a sensing temperature in accordance with some embodiments of the inventive concept.

FIG. 9 is a flowchart illustrating a method of detecting a sensing temperature in accordance with some embodiments of the inventive concept. Referring to FIGS. 8 and 9, in a step S110, the sensing temperature calculation unit 124 receives the first interrupt signal INT1.

In a step S120, if the first interrupt signal INT1 is received, the sensing temperature calculation unit 124 senses a sensing temperature ST. The sensing temperature ST is a temperature of the nonvolatile memory device 110 or an ambient temperature of the nonvolatile memory device 110. In a step S130, the sensing temperature calculation unit 124 stores the sensing temperature ST until the second interrupt signal INT2 is input.

Figure 10:
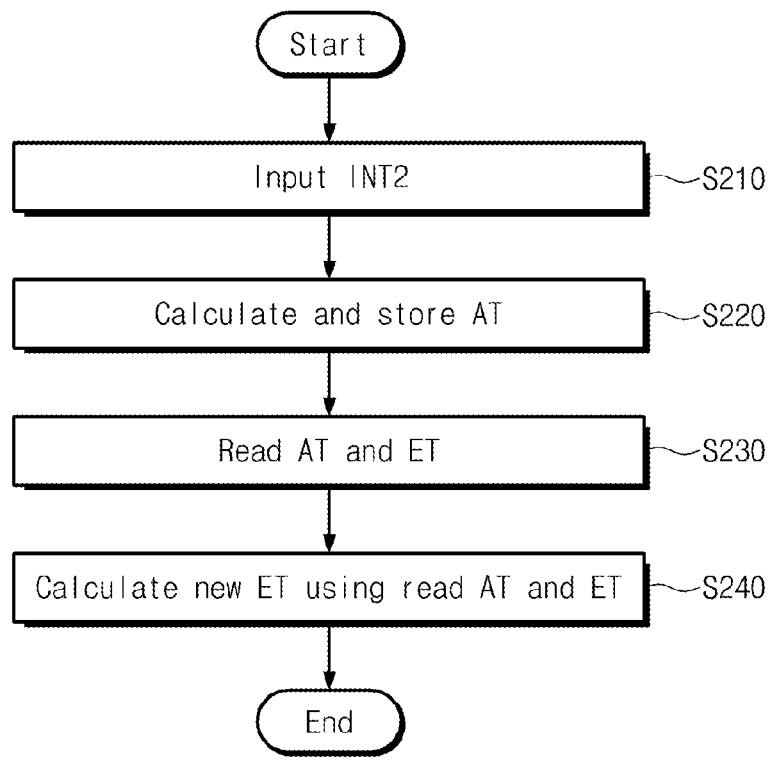
FIG. 10 is a flowchart illustrating a method of calculating elapsed time in accordance with some embodiments of the inventive concept.

FIG. 10 is a flowchart illustrating a method of calculating elapsed time in accordance with some embodiments of the inventive concept. Referring to FIG. 10, in a step S210, the sensing temperature calculation unit 124 and the elapsed time calculation unit 125 receive the second interrupt signal INT2.

In a step S220, if the second interrupt signal INT2 is received, the sensing temperature calculation unit 124 obtains an average sensing temperature AT of the sensed sensing temperature ST in response to the first interrupt signal INT1 for a certain period of time. The sensing temperature calculation unit 124 can store the average sensing temperature AT in the RAM 130. If an average sensing temperature AT stored in the RAM in advance exists, the sensing temperature calculation unit 124 can store a new average sensing temperature AT in the RAM 130.

In a step S230, the elapsed time calculation unit 125 can read an average sensing temperature AT and a new elapsed time ET from the RAM 130.

In a step S240, the elapsed time calculation unit 125 calculates a new elapsed time ET using the average sensing temperature AT and the new elapsed time ET which were read. The new elapsed time ET can be obtained by adding a weighted elapsed time WET to an elapsed time ET sensed from the RAM 130. The weighted elapsed time WET is determined according to the average sensing temperature AT. The elapsed time calculation unit 125 then stores the new elapsed time ET in the RAM 130. The second interrupt signal INT2 may occur over a period of 1000 seconds. Accordingly, the elapsed time ET is calculated over a period of 1000 seconds and can be renewed in the RAM 130.

FIG. 11 is a table being used to calculate elapsed time. FIG. 11 is a predetermined table PDT in which weighted elapsed time WET information is stored in advance. The weighted elapsed time WET means a time being added to the existing elapsed time to obtain a new elapsed time ET. The weighted elapsed time WET may be determined depending on a range of the average sensing temperature AT and a range to which an existing elapsed time ET belongs.

Referring to FIG. 11, the predetermined table PDT may include weighted elapsed time information according to a range of the average sensing temperature AT and a range of an elapsed time ET. For example, if the average sensing temperature AT is included in a first range R1_AT and the elapsed time ET is included in a first range R1_ET, a first weighted elapsed time WET1 may be selected. The first range R1_ET of the elapsed time ET may be a range smaller than the first time T1.

If the average sensing temperature AT is included in the first range R1_AT and the elapsed time ET is included in a second range R2_ET, a second weighted elapsed time WET2 may be selected. The second range R2_ET of the elapsed time ET may be a range greater than the first time T1 and smaller than the second time T2. The second weighted elapsed time WET2 is a time longer than the first weighted elapsed time WET1.

If the average sensing temperature AT is included in the first range R1_AT and the elapsed time ET is included in a third range R3_ET, a third weighted elapsed time WET3 may be selected. The third range R3_ET of the elapsed time ET may be a range greater than the second time T2 and smaller than a third time T3. The third weighted elapsed time WET3 is a time longer than the second weighted elapsed time WET2.

If the average sensing temperature AT is included in a second range R2_AT and the elapsed time ET is included in the first range R1_ET, a fourth weighted elapsed time WET4 may be selected. The second range R2_AT of the average sensing temperature AT may be a range greater than the first range R1_AT. The fourth weighted elapsed time WET4 is a time longer than the first weighted elapsed time WET1.

If the average sensing temperature AT is included in the second range R2_AT and the elapsed time ET is included in the second range R2_ET, a fifth weighted elapsed time WET5 may be selected. The fifth weighted elapsed time WET5 is a time longer than the second weighted elapsed time WET2 and the fourth weighted elapsed time WET4.

If the average sensing temperature AT is included in the second range R2_AT and the elapsed time ET is included in the third range R3_ET, a sixth weighted elapsed time WET6 may be selected. The sixth weighted elapsed time WET6 is a time longer than the third weighted elapsed time WET3 and the fifth weighted elapsed time WET5.

If the average sensing temperature AT is included in a third range R3_AT and the elapsed time ET is included in the first range R1_ET, a seventh weighted elapsed time WET7 may be selected. The third range R3_AT of the average sensing temperature AT is a temperature higher than the second range R2_AT. The seventh weighted elapsed time WET7 is a time longer than the fourth weighted elapsed time WET4.

If the average sensing temperature AT is included in the third range R3_AT and the elapsed time ET is included in the second range R2_ET, an eighth weighted elapsed time WET8 may be selected. The eighth weighted elapsed time WET8 is a time longer than the fifth weighted elapsed time WET5 and the seventh weighted elapsed time WET7.

If the average sensing temperature AT is included in the third range R3_AT and the elapsed time ET is included in the third range R3_ET, a ninth weighted elapsed time WET9 may be selected. The ninth weighted elapsed time WET9 is a time longer than the sixth weighted elapsed time WET6 and the eighth weighted elapsed time WET8.

As illustrated in the predetermined table PDT of FIG. 11, the higher the average sensing temperature AT becomes and the longer the elapsed time ET becomes, the longer the weighted elapsed time WET becomes.

In FIG. 11, the elapsed time ET was described to be selected to be one of the first through third ranges R1_ET~R3_ET. However, a range of the elapsed time ET is not limited thereto. A range of the elapsed time ET may be divided into more than 3 or less than 3. Also, the average sensing temperature AT was described to be selected to be one of the first through third ranges R1_AT~R3_AT. However, a range of the average sensing temperature AT is not limited to 3. A range of the average sensing temperature AT may be divided into more than 3 or less than 3.

FIG. 12 is a table illustrating an example of elapsed time stamps registered in a time stamp table. FIG. 12 is a time stamp table TST with respect to elapsed times ET1~ETn after data DATA1~DATAn is written. Referring to FIGS. 1 and 12, the first elapsed time ET1 showing an elapsed time after the first data DATA1 is written may be registered as an elapsed time stamp ETS.

After the first data DATA1 is written, the second data DATA2 may be written. The second elapsed time ET2 showing an elapsed time after the second data DATA2 is written may be registered as an elapsed time stamp ETS.

After the second data DATA2 is written, the third through nth data DATA3~DATAn may be sequentially written. The third through nth elapsed times ET3~ETn showing an elapsed time after third through nth data DATA3~DATAn are written may be registered as an elapsed time stamp ETS.

A size of the first through nth data DATA1~DATAn may be the same as a write unit and a read unit of the nonvolatile memory device 110. However, the inventive concept is not limited thereto. A size of the first through nth data DATA1~DATAn may be greater or smaller than a write unit and a read unit of the nonvolatile memory device 110.

The elapsed time stamp ETS of the time stamp table TDT may be periodically renewed. For example, the elapsed time stamp ETS may be renewed over a period of 1000 seconds. Referring to FIGS. 1, 11 and 12, the elapsed time stamp ETS may be renewed based on the predetermined table PDT. A weighted elapsed time WET is selected according to the elapsed time stamp ETS and the average sensing temperature AT. A new elapsed time ET obtained by adding a selected weighted elapsed time WET to the elapsed times ET1~ETn written in the elapsed time stamp ETS is written in the time stamp table TST.

The time stamp table TST may be stored in the RAM 130 in the form of a first time stamp table TST1. The time stamp table TST may be backed up in the nonvolatile memory device 110 in the form of a second time stamp table TST2.

Figure 13:
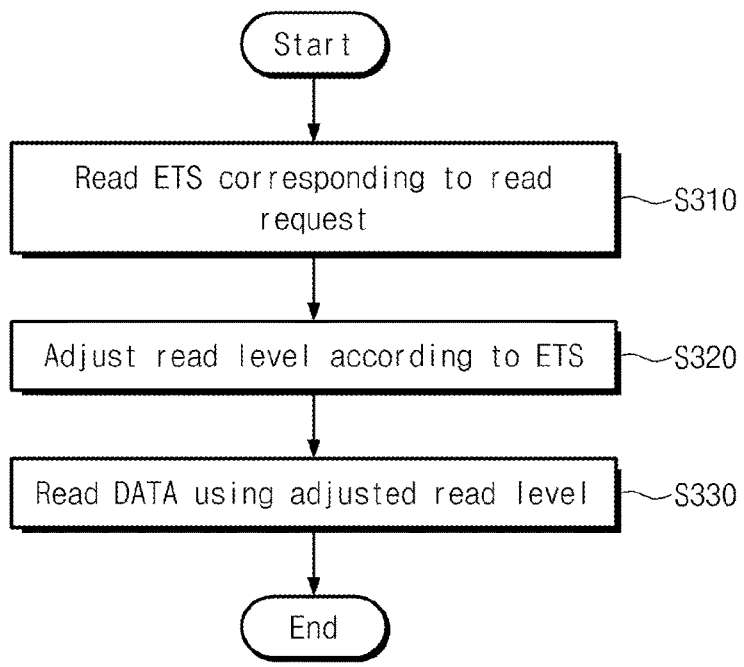
FIG. 13 is a flowchart illustrating a method of reading data from a nonvolatile memory device in accordance with some embodiments of the inventive concept.

FIG. 13 is a flowchart illustrating a method of reading data from a nonvolatile memory device in accordance with some embodiments of the inventive concept. Referring to FIGS. 1, 12 and 13, in a step S310, the memory controller 120 reads an elapsed time stamp according to a read request. For example, a read request may occur inside the memory controller 120 or a read request may be received from an external host. The memory controller 120 can read an elapsed time stamp ETS through the first time stamp table TST1 stored in the RAM 130 according to a read request.

In a step S320, the memory controller 120 can control a read level through the elapsed time stamp ETS read from the RAM 130. For example, the memory controller 120 can transfer a command or a control signal that can control read voltages to the nonvolatile memory device 110. In a step S330, the memory controller 110 may transfer a command to read data using the controlled read voltages.

As described above, the storage device 100 is configured to manage a change a temperature of the nonvolatile memory device 110 or an ambient temperature of the nonvolatile memory device 110 and an elapsed time due to a temperature. After data is written in the nonvolatile memory device 110, the storage device 100 writes an average sensing temperature AT and an elapsed time ET according to a temperature in the time stamp table TST as an elapsed time stamp ETS. A predetermined table PDT in which a weighted elapsed time WET is written is needed to renew the elapsed time ET. The weighted elapsed time WET is determined by the elapsed time stamp ETS and the average sensing temperature AT that are written in the time stamp table TST. The weighted elapsed time WET is selected through a range of an average sensing temperature AT periodically calculated and an elapsed time stamp ETS written in the time stamp table TST. The elapsed time stamp ETS is renewed by adding the selected weighted elapsed time WET to an elapsed time ET of the elapsed time stamp ETS.

Figure 14:
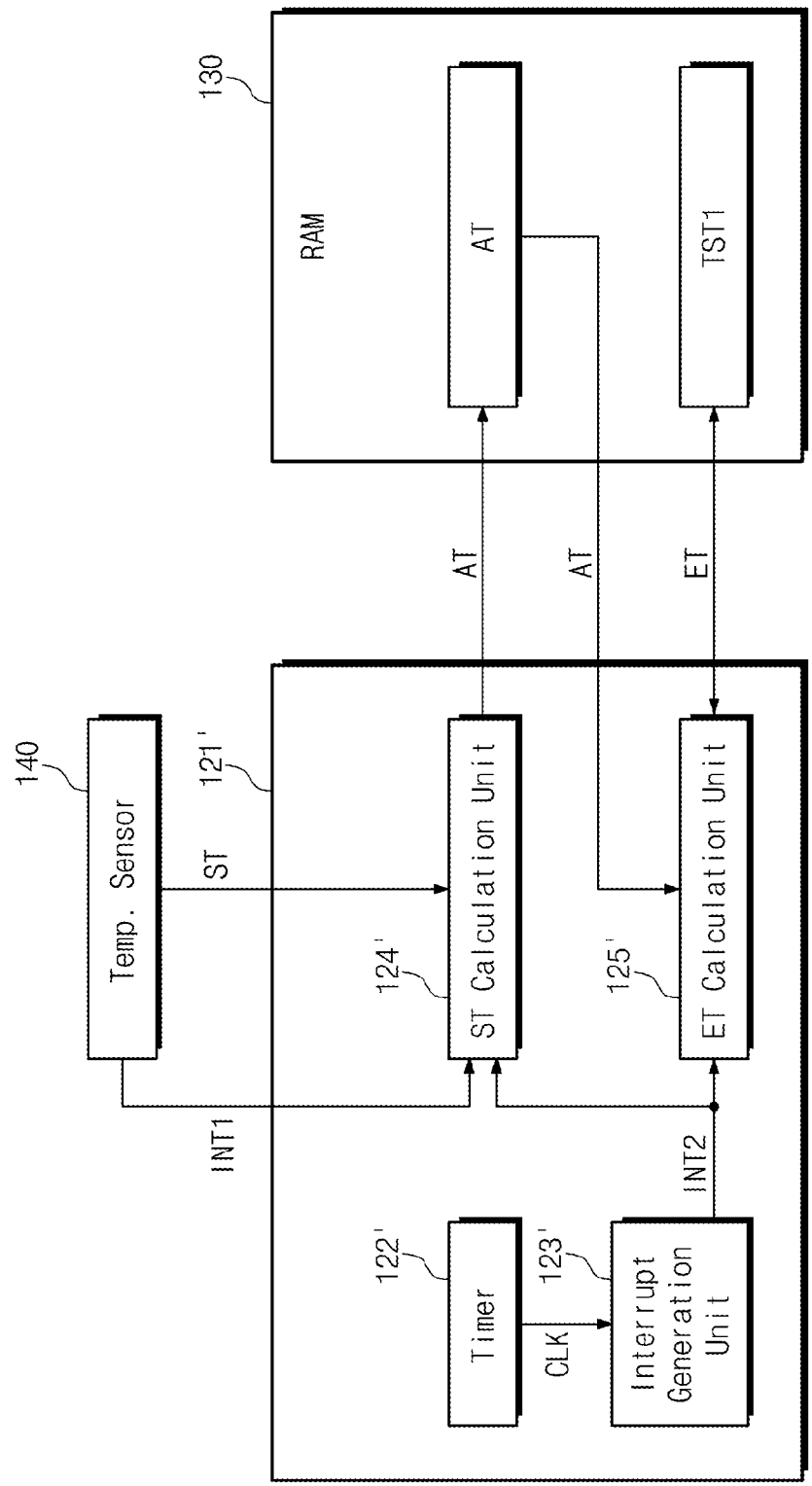
FIG. 14 is a block diagram illustrating an elapsed time calculation unit, and a RAM and a temperature sensor related to the elapsed time calculation unit in accordance with some other embodiments of the inventive concept.

FIG. 14 is a block diagram illustrating an elapsed time calculation unit, and a RAM and a temperature sensor related to the elapsed time calculation unit in accordance with some other embodiments of the inventive concept. Referring to FIG. 14, an elapsed time calculation unit 121' includes a timer 122', an interrupt generation unit 123', a sensing temperature calculation unit 124' and an elapsed time calculation unit 125'.

The timer 122' can output a clock signal CLK at each certain period of time.

The interrupt generation unit 123' can receive the clock signal CLK. The interrupt generation unit 123' can generate a second interrupt signal INT2 in response to the received clock signal CLK.

The temperature sensor 140 can sense a temperature of the nonvolatile memory device 110 or an ambient temperature of the nonvolatile memory device 110. The temperature sensor 140 can output a first interrupt signal INT1 each time that a temperature of the nonvolatile memory device 110 or an ambient temperature of the nonvolatile memory device 110 is changed. The temperature sensor 140 can output a sensing temperature ST to the sensing temperature calculation unit 124' together with the first interrupt signal INT1. The temperature sensor 140 may be located inside the nonvolatile memory device 110.

The sensing temperature calculation unit 124' can receive a sensing temperature ST and the first interrupt signal INT1 from the temperature sensor 140. The sensing temperature calculation unit 124' can receive the second interrupt signal INT2 from the interrupt generation unit 123'. If the second interrupt signal INT2 is received, the sensing temperature calculation unit 124' can calculate an average sensing temperature AT with respect to the received sensing temperature ST. The sensing temperature calculation unit 124' can then store the calculated average sensing temperature AT in the RAM 130.

The elapsed time calculation unit 125' can receive the second interrupt signal INT2 from the interrupt generation unit 123'. If the second interrupt signal INT2 is received, the elapsed time calculation unit 125' reads the average sensing temperature AT, and elapsed time information stored in the first time stamp table TST1 from the RAM 130. The elapsed time calculation unit 125' reads a weighted elapsed time WET from the predetermined table PDT based on the average sensing temperature WET and the elapsed time information and calculates a new elapsed time ET by adding the weighted elapsed time WET to the elapsed time ET. The elapsed time calculation unit 125' then stores the new elapsed time ET in the first time stamp table TST1 of the RAM 130.

In FIG. 8, a sensing temperature ST sensed in the temperature sensor 140 is received to the sensing temperature calculation unit 124 each time that the first interrupt signal INT1 occurs in the interrupt generation unit 123. However, in FIG. 14, a sensing temperature ST is received at the sensing temperature calculation unit 124' each time that a temperature of the nonvolatile memory device 110 or an ambient temperature of the nonvolatile memory device 110 is changed.

Figure 15:
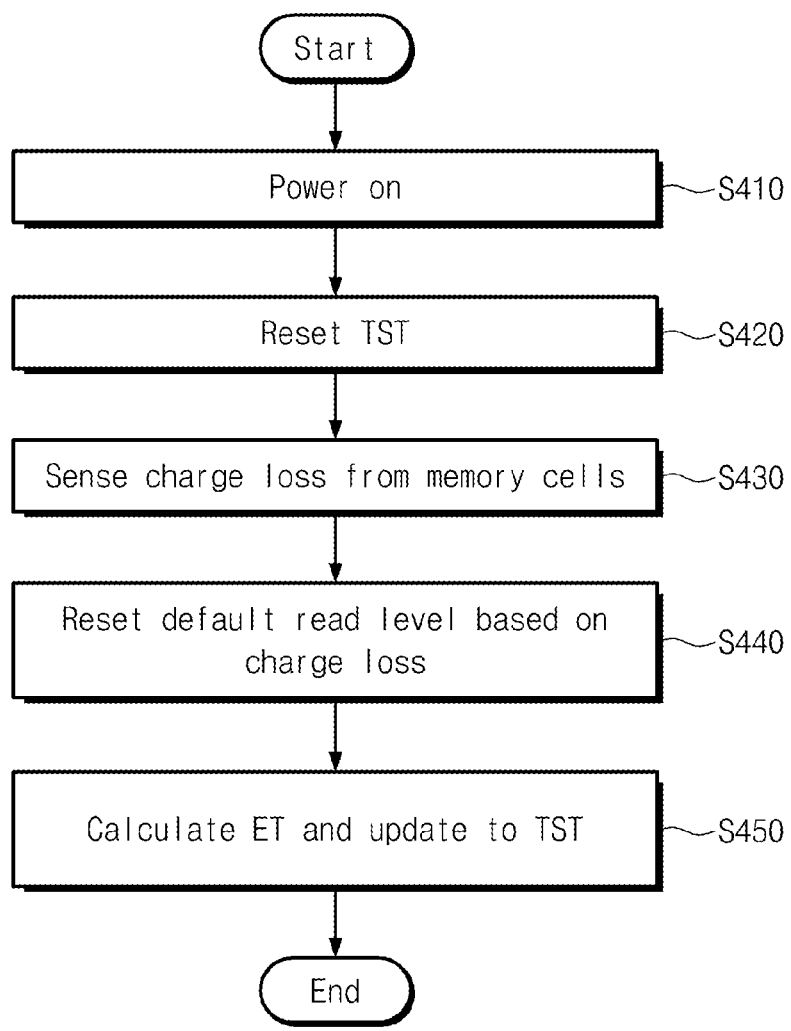
FIG. 15 is a flowchart illustrating a method that a storage device restores elapsed time when power of the storage device is restored.

FIG. 15 is a flowchart illustrating a method of a storage device restoring elapsed time when power of the storage device is restored. Referring to FIGS. 1 and 15, in a step S410, power of the storage device 100 is restored. Power of the storage device 100 can be removed by a normal power off or a sudden power off.

In a step S420, if power of the storage device 100 is restored, the first and second time stamp tables TST1 and TST2 stored in the RAM 130 and the memory controller 120 are reset to an initial state. Elapsed time stamps ETS of the first and second time stamp tables TST1 and TST2 may be reset to '0'.

In a step S430, a reduced amount of charges of memory cells is measured. Referring to FIG. 7, an amount of charges of the memory cells is reduced in proportion to time. Thus, since an amount of charges is reduced while the storage device 100 is powered off, the reduced amount of charges should be sensed until the storage device 100 is powered on again from after the program operation is performed.

In a step S440, an initial read voltage level is adjusted based on the reduced amount of charges of the memory cells. An initial read voltage level of before the storage device 100 is powered off is set right after the program operation is performed. However, after the storage device 100 is powered on, a distribution of charges moved due to a reduction of charges of the memory cells. Thus, an initial read voltage level must be adjusted in proportion to a distribution movement.

In a step S450, an elapsed time ET is calculated and the calculated elapsed time ET is updated in the first and second time stamp tables TST1 and TST2 in the form of the elapsed time stamp ETS. The first and second time stamp tables TST1 and TST2 may be renewed using the elapsed time calculation method described through FIGS. 8 through 12. If a read command occurs in the storage device 100, a read voltage level may be adjusted based on the changed basic read voltage level.

Figure 16:
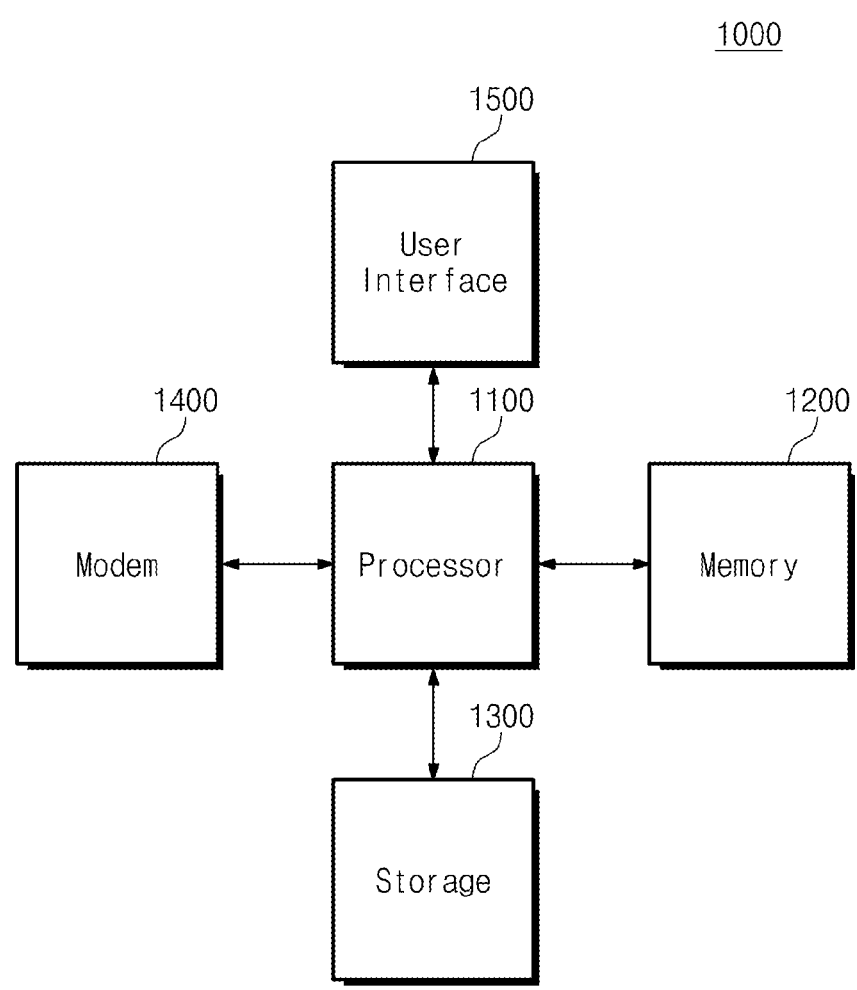
FIG. 16 is a block diagram illustrating a computing device in accordance with some embodiments of the inventive concept.

FIG. 16 is a block diagram illustrating a computing device in accordance with some embodiments of the inventive concept. Referring to FIG. 16, the computing device 1000 includes a processor 1100, a memory 1200, storage 1300, a modem 1400 and a user interface 1500.

The processor 1100 can control an overall operation of the computing device 1000 and perform a logical operation. The processor 1100 may be a general purpose processor, a special purpose processor, or an application processor.

The memory 1200 can communicate with the processor 1100. The memory 1200 may be a main memory of the processor 1100 or the computing device 1000. The memory 1200 may include a volatile memory such as a SRAM, a DRAM, a SDRAM, etc. or a nonvolatile memory such as a PRAM, a MRAM, an RRAM, a FeRAM, etc.

The storage 1300 can store data which has to be stored for a long time in the computing device 1000. The storage 1300 may include a hard disc drive (HDD), or a nonvolatile memory device such as a flash memory, a PRAM, a MRAM an RRAM, a FRAM, etc. The storage 1300 may include the storage device 100 in accordance with some embodiments of the inventive concept. The storage 1300 can adjust a read level for reading data programmed in the nonvolatile memory device 110 on the basis of an elapsed time ET and an average sensing temperature AT according to the elapsed time ET.

The modem 1400 can perform a communication with an external device according to a control of the processor 1100. For example, the modem 1400 can perform a wired or wireless communication with an external device. The modem 1400 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a motor, etc.

Figure 17:
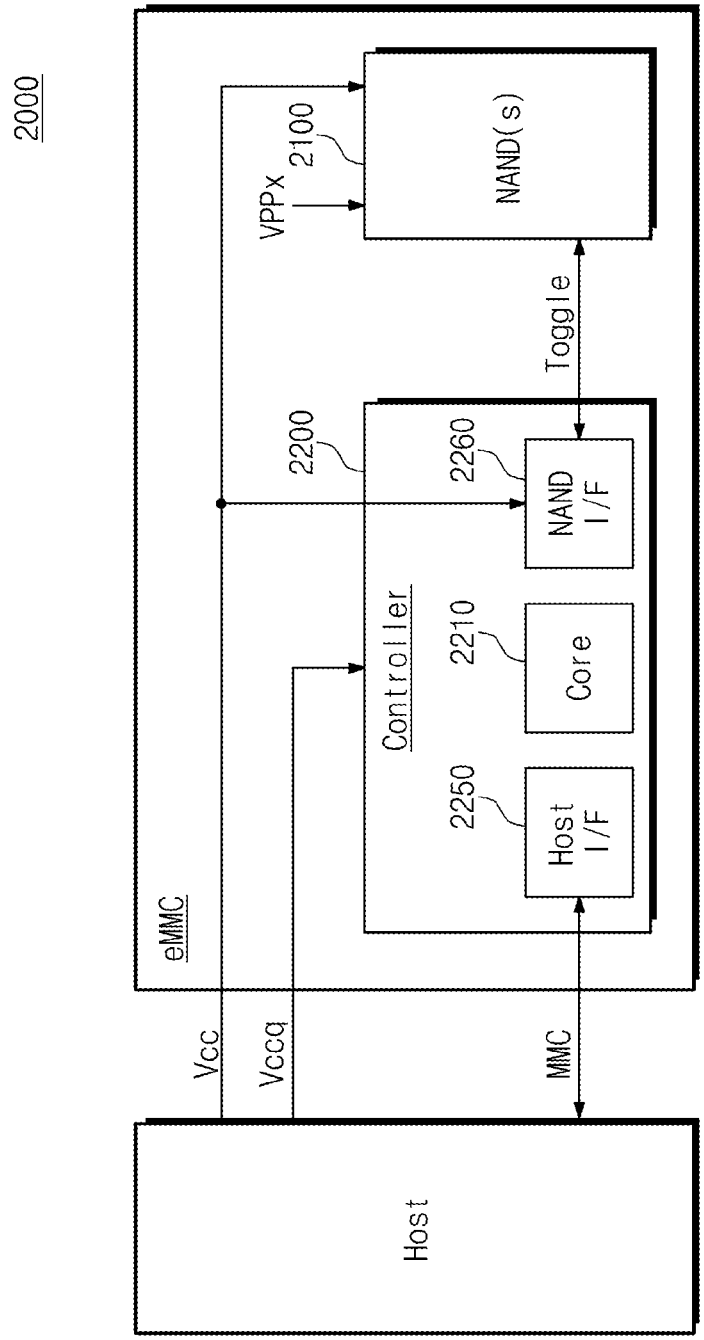
FIG. 17 is a block diagram illustrating an embedded multimedia device in accordance with some embodiments of the inventive concept.

FIG. 17 is a block diagram illustrating an embedded multimedia device in accordance with some embodiments of the inventive concept. Referring to FIG. 17, the embedded multimedia card (eMMC) device 2000 may include at least one NAND flash memory device 2100 and a controller 2200.

The controller 2200 is connected to the NAND flash device 2100 through a plurality of channels. The controller 2200 may include at least one core 2210, a host interface 2250, and an interface 2260. The core 2210 controls an overall operation of the embedded multimedia card (eMMC) device 2000. The host interface 2250 can provide an interface function of the host to the controller 2200. The NAND interface 2260 can provide an interface function of the controller 2200 to the NAND flash memory device 2100.

The host interface 2250 may be a parallel interface (for example, a MMC interface). The host interface 2250 of the eMMC device 2000 may also be a serial interface (for example, UHS-II, UFS interface).

The eMMC device 2000 is provided with first and second power supply voltages Vcc and Vccq from the host. The first power supply voltage Vcc is provided to the NAND flash memory device 2100 and the NAND interface 2260. The second power supply voltage Vccq is provided to the controller 2200.

The eMMC device 2000 may include the storage device 100 of the inventive concept. The eMMC device 2000 can adjust a read level for reading data programmed in the nonvolatile memory device 110 on the basis of an elapsed time ET and an average sensing temperature AT according to the elapsed time ET.

A storage device in accordance with some embodiments of the inventive concept adjusts a read voltage needed to read data considering a change of an average sensing temperature in accordance with time progress. Thus, according to the inventive concept, a storage device that can reduce an error rate of data and increase data reliability may be provided.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein

What is claimed is:

1. A method of operating a storage device including a nonvolatile memory device, a controller configured to control the nonvolatile memory device, and a temperature sensor configured to measure temperature of the nonvolatile memory device, the method comprising:
   calculating, by the controller, an average sensing temperature of temperatures measured by the temperature sensor over a period of time;
   periodically calculating, by the controller, an elapsed time of data after the data is programmed in the nonvolatile memory device based upon the average sensing temperature, the elapsed time in the form of an elapsed time stamp,
   wherein periodically calculating the elapsed time comprises determining a weighted elapsed time which depends on the average sensing temperature and a first elapsed time most recently calculated, and calculating a new elapsed time as the elapsed time by adding the determined weighted elapsed time and the first elapsed time;
   adjusting, by the controller, a read voltage level in accordance with the elapsed time stamp; and
   reading, by the controller, the data from the nonvolatile memory device using the adjusted read voltage level.

2. The method of claim 1, wherein as the average sensing temperature becomes higher, the weighted elapsed time increases.

3. The method of claim 1, wherein as the first elapsed time becomes longer, the weighted elapsed time increases.

4. A storage device comprising:
   a nonvolatile memory device;
   a memory controller configured to control the nonvolatile memory device; and
   a temperature sensor configured to measure temperature of the nonvolatile memory device,
   wherein the memory controller is configured to calculate an average sensing temperature using temperatures measured by the temperature sensor over a period of time, adjust a read voltage level according to the average sensing temperature and an elapsed time of data after the data is programmed in the nonvolatile memory device, and read the data from the nonvolatile memory device using the adjusted read voltage level,
   wherein the temperature sensor is configured to measure the temperature of the nonvolatile memory device each time the temperature is changed and to transfer the measured temperature to the memory controller, and
   wherein the memory controller is further configured to select a weighted elapsed time which depends on the average sensing temperature and a range of the elapsed time of data after the data is programmed in the nonvolatile memory device.

5. The storage device of claim 4, wherein the storage device further comprises a RAM, and the memory controller is configured to periodically store the average sensing temperature in the RAM.

6. The storage device of claim 5, wherein the memory controller is configured to periodically calculate the average sensing temperature.

7. The storage device of claim 6, wherein the memory controller is configured to obtain a new elapsed time by adding the weighted elapsed time and the elapsed time to store the new elapsed time in the RAM as an elapsed time stamp.

8. The storage device of claim 7, wherein when a read operation is requested, the memory controller is configured to read the elapsed time stamp most recently renewed from the RAM, and adjust the read voltage level according to the read elapsed time stamp.

9. The storage device of claim 8, wherein when the storage device is powered on after it is powered off, the memory controller is configured to sense a new initial read voltage level, reset a time stamp table, and measure the elapsed time again.

10. A method of accessing a storage device including a nonvolatile memory device, a controller, and a temperature sensor configured to measure temperature of the nonvolatile memory device, the method comprising:
    periodically calculating, by the controller, an average sensing temperature using temperatures measured by the temperature over a period of time;
    periodically renewing, by the controller, an elapsed time of data after the data is programmed in the nonvolatile memory device, the renewed elapsed time in a form of an elapsed time stamp,
    wherein the renewed elapsed time is determined according to a weighted elapsed time which depends on a change of the average sensing temperature and a length of a most recently renewed elapsed time;
    adjusting, by the controller, a read voltage level using the elapsed time stamp; and
    reading, by the controller, the data from the nonvolatile memory device by applying the adjusted read voltage level.

11. The method of claim 10, wherein the renewed elapsed time increases in proportion to the average sensing temperature.

12. The method of claim 10, wherein the renewed elapsed time increases in proportion to a length of the elapsed time most recently renewed.

13. A storage device comprising:
    a nonvolatile memory device;
    a memory controller configured to control the nonvolatile memory device; and
    a temperature sensor configured to measure temperature of the nonvolatile memory device,
    wherein the memory controller is configured to
    calculate an average sensing temperature using temperatures measured by the temperature sensor over a period of time,
    periodically calculate an elapsed time of data after the data is programmed in the nonvolatile memory device by determining a weighted elapsed time which depends on the average sensing temperature and a first elapsed time most recently calculated, and adding the determined weighted elapsed time and the first elapsed time, the calculated elapsed time in a form of an elapsed time stamp,
    adjust a read voltage level in accordance with the elapsed time stamp, and
    read the data using the adjusted read voltage level.

14. The storage device of claim 13, wherein as the average sensing temperature becomes higher, the weighted elapsed time increases.

15. The storage device of claim 13, wherein as the first elapsed time becomes longer, the weighted elapsed time increases.

* * * * *